(12) United States Patent
Kang et al.

(10) Patent No.: US 7,860,474 B1
(45) Date of Patent: *Dec. 28, 2010

(54) CIRCUITS AND METHODS FOR CONTROLLING SWITCHING NOISE IN SWITCHED-MODE CIRCUITS

(75) Inventors: Chang Yong Kang, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 755 days.

This patent is subject to a terminal disclaimer.

(21) Appl. No.: 11/452,170

(22) Filed: Jun. 13, 2006

Related U.S. Application Data

(60) Division of application No. 11/233,961, filed on Sep. 23, 2005, now Pat. No. 7,142,819, which is a continuation-in-part of application No. 10/715,950, filed on Nov. 18, 2003, now Pat. No. 7,010,271.

(51) Int. Cl.
*H04B 1/10* (2006.01)

(52) U.S. Cl. ............ 455/296; 455/71; 455/78; 455/130; 455/142; 455/422.1; 330/10; 330/251

(58) Field of Classification Search .......... 455/71, 455/78, 130, 142, 296, 422; 330/10, 251
See application file for complete search history.

(56) References Cited

U.S. PATENT DOCUMENTS 6,150,969 A * 11/2000 Melanson .............. 341/143
6,587,670 B1 * 7/2003 Hoyt et al. ............. 455/63.1

* cited by examiner

*Primary Examiner*—Stephen M D'Agosta
(74) *Attorney, Agent, or Firm*—Thompson & Knight LLP; James J. Murphy

(57) ABSTRACT

A method of controlling noise in a pulse width modulation circuit includes varying a sample frequency and a range of information levels, wherein each sample within a data sample stream at the sample frequency represents a level within the range of information levels, to shift in frequency noise generated at the sample frequency during encoding of the data sample stream into pulse width modulated patterns.

13 Claims, 3 Drawing Sheets

CIRCUITS AND METHODS FOR CONTROLLING SWITCHING NOISE IN SWITCHED-MODE CIRCUITS

CROSS REFERENCE TO RELATED APPLICATIONS

This application for patent is a divisional of pending application Ser. No. 11/233,961, filed Sep. 23, 2005.

This application is a Continuation-In-Part application of pending application U.S. Ser. No. 10/715,950 entitled "Circuits and Methods for Reducing Interference from Switched Mode Circuits" filed on Nov. 18, 2003, which is a continuation of U.S. Ser. No. 09/651,821 entitled "Circuits and Methods for Reducing Interference from Switched Mode Circuits" filed on Aug. 30, 2000 which is abandoned.

FIELD OF INVENTION

The present invention relates in general to switched—mode circuit techniques, and in particular, to circuits and methods for controlling switching noise in switched—mode circuits.

BACKGROUND OF INVENTION

Class D audio power amplifiers (APAs) have been used for many years in systems, such as wireline telephony, where high bandwidth is not critical. More recently however, new fabrication techniques, and in particular, new techniques for fabricating power transistors, have made integrated Class D APAs possible. This result has extended their potential applications to lower-power, higher-bandwidth systems, including battery-powered portable music players and wireless communications devices.

One major advantage of Class D amplifiers is their efficiency. Generally, an input signal is converted into a relatively high frequency stream of pulses varying in width with the amplitude of the input signal. This pulse width modulated (PWM) signal switches a set of power output transistors driving an output load between cutoff and saturation, which results in efficiencies above ninety percent (90%). In contrast, the typical Class AB push-pull amplifier, using output transistors in which their conduction varies linearly during each half-cycle, has an efficiency of only around sixty percent (60%). The increased efficiency of Class D amplifiers in turn reduces power consumption and consequently lowers heat dissipation and improves battery life.

Similarly, switched mode power supplies have found wide acceptance in the design of compact electronic appliances. Switched mode power supplies advantageously use smaller transformers and are therefore typically more compact and of lighter weight. These features are in addition to the increased efficiency realized over linear power supplies. Moreover, the total number of components can be reduced to, for example, a power MOSFET die and a PWM controller die packaged together in a single package.

One of the disadvantages of using conventional switched mode devices is the interference (radiated and conducted) generated by the switching mechanism. This problem is of particular concern in compact electronic appliances which include a radio and similar audio circuits. For example, if the switching frequency of the given switched—mode device is nominally at 350 kHz, harmonics will be generated at 700 kHz, 1050 kHz and 1400 kHz, all of which fall within the AM radio broadcast band.

Given the importance of improved battery-life, reduced heat dissipation, and component size minimization in the design and construction of portable electronic appliances, improved switched mode techniques will have numerous practical advantages. The possible applications for these techniques are numerous, although Class D APAs and switched mode power supplies are two primary areas which should be considered.

SUMMARY OF INVENTION

The principles of the present invention are embodied in circuits and methods for controlling interference in systems, such as radio receivers, utilizing switched-mode circuitry. According to one particular embodiment of these principles, a method is disclosed for controlling noise in a pulse width modulation circuit, which includes varying a sample frequency and a range of information levels, wherein each sample within a data sample stream at the sample frequency represents a level within the range of information levels, to shift in frequency noise generated at the sample frequency during encoding of the data sample stream into pulse width modulated patterns.

The inventive concepts address one of the major disadvantages of conventional switched mode devices, namely, interference (noise) caused by the switching mechanism itself. This interference is of particular concern in systems employing radio receivers and similar interference sensitive circuitry. In accordance with the inventive principles, the switching frequency is shifted as a function of the radio frequency being received such that the switching frequency and its harmonics fall outside the frequency band of the received signal. Advantageously, these principles can be applied to different types of switched circuitry, including Class D amplifiers and power supplies.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
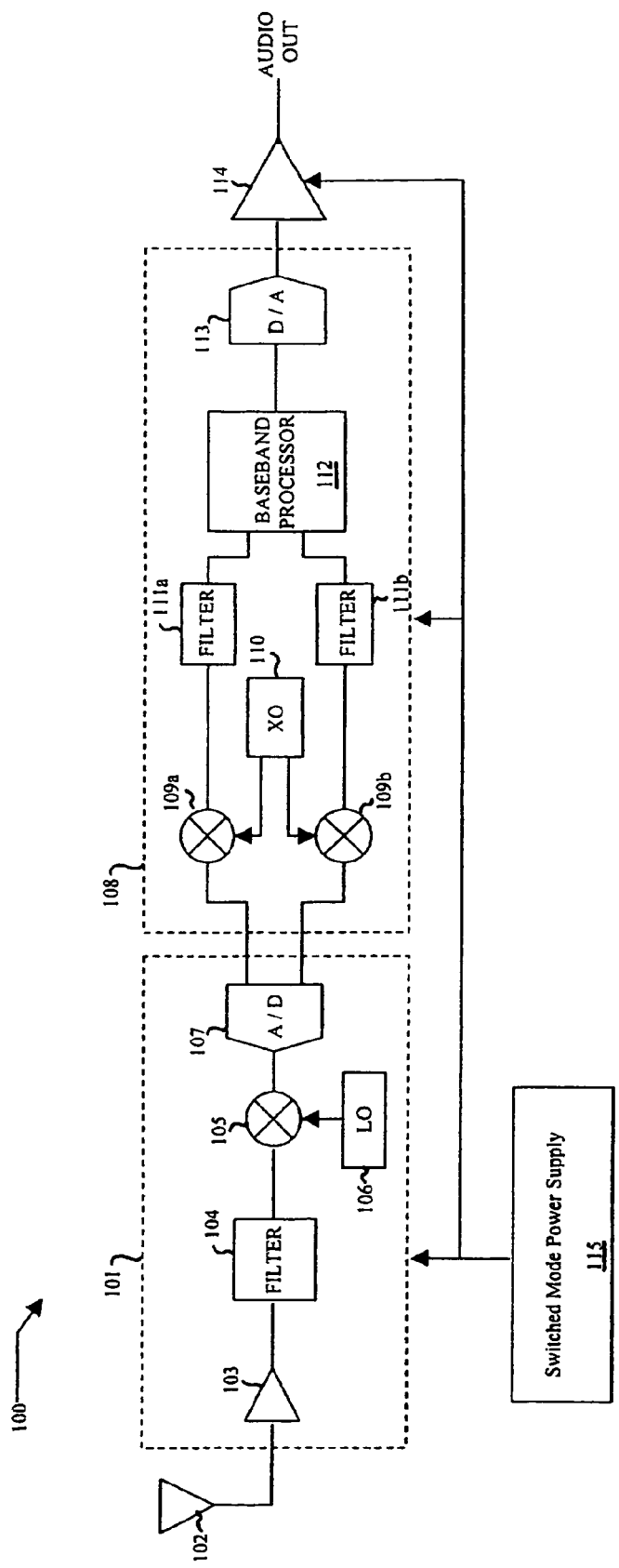
FIG. 1 is a high-level block diagram of a representative radio receiver suitable for describing one particular application of the principles of the present invention.

The principles of the present invention and their advantages are best understood by referring to the illustrated embodiment depicted in FIGS. 1-2 of the drawings, in which like numbers designate like parts.

FIG. 1 is block diagram of one channel of a digital radio 100 embodying the principles of the present invention. Digital radio 100 includes an analog section or front-end 101 which receives radio frequency (RF) signals from an associated antenna 102. Analog front-end 101 is preferably a conventional RF down-converter including a low noise amplifier (LNA) 103 for setting the system noise figure, a bandpass filter 104, and a mixer 105 driven by an analog local oscillator 106. The mixed-down analog signal is then converted into digital form by an analog to digital converter 107.

The digitized data output from A/D converter 107 is passed to digital processing section 108. Mixers 109a and 109b generate in-phase (I) and quadrature (Q) signals from a corresponding pair of clock phases from crystal oscillator 110. The I and Q signals are next passed through bandpass filters 111a and 111b and on to digital baseband processor 112. The processed digital signal is then re-converted to analog (audio) form by D/A converter 113.

According to the principles of the present invention, a switched-mode (Class D) audio power amplifier (APA) 114, discussed in detail below, is used to drive an external set of speakers or a headset (not shown). Preferably, at least some of the components of digital radio 100 are powered by a switched-mode power supply (SMPS) 114.

As discussed above, Class-D amplifiers generally utilize pulse-width (duty cycle) modulation (PWM) techniques, which realize a high efficiency amplifier operation by directly pumping electric current into an inductor-capacitor (L-C) filter through low-resistance power transistors. These low-resistance transistors are typically driven by a delta-sigma modulator, which quantizes and noise shapes the input signal, and a pulse width modulation (PWM) stage, which encodes the quantized samples output from the delta-sigma modulator into a stream of PWM encoded patterns. The output from the PWM stage drives the gates of the power transistors, which may be in either a half-bridge or full bridge configuration. The fundamental switching frequency of the power transistors approximates the output sample frequency of the delta-sigma modulator quantizer, $F_{SO}$.

A convenient system design, often utilized in audio systems, is based on the relationship:

$$F_{MCLK} = F_{SO} \cdot (N_{Level} - 1)$$

in which $F_{MCLK}$ is the master clock signal (oversampling) frequency of the system, $N_{Level}$ is the number of the quantizer levels at the delta-sigma modulator quantizer output, and $F_{SO} \cdot (N_{Level} - 1)$ is the data or "chip" rate of the PWM encoded patterns output from the PWM encoder.

In digital radio systems including a Class D amplifier operating at a typical output sample frequency $F_{SO}$ of several hundreds of KHz, the resulting switching related interference can make it very difficult to tune to radio stations operating at a frequency at, or close to, the $F_{SO}$ frequency. One possible solution to addressing this problem is to shift the master clock frequency $F_{MCLK}$, and hence the output sample frequency $F_{SO}$, when tuning to a radio station broadcasting at the same or a close frequency. However, this technique is costly to implement as it generally requires utilization of a phase-locked loop (PLL) circuit in the system.

According to the principles of the present invention, the master clock signal frequency $F_{MCLK}$ remains fixed, while the sample output frequency $F_{SO}$ is varied during radio frequency tuning to avoid the radio frequency band of interest. At the same time, the number of quantizer levels $N_{Level}$ is varied to preserve the information content in the PWM encoded signal. Generally, when the output sample frequency $F_{SO}$ is reduced, the number of quantizer levels $N_{Level}$ increases, and vice versa.

Figure 2A:
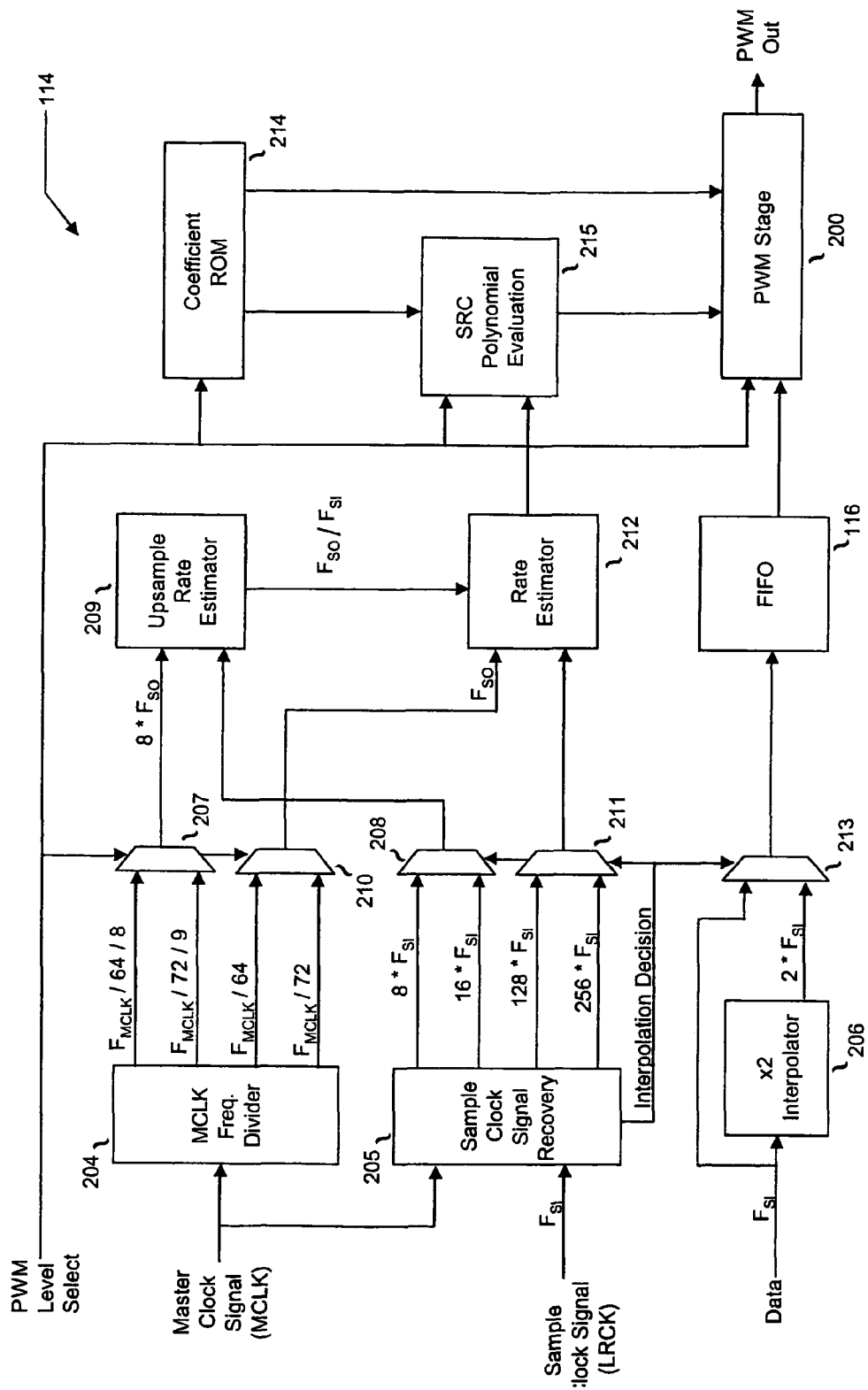
FIG. 2A is a block diagram of an exemplary audio power amplifier (APA) embodying the principles of the present invention and suitable for utilization in the radio receiver of FIG. 1.
Figure 2B:
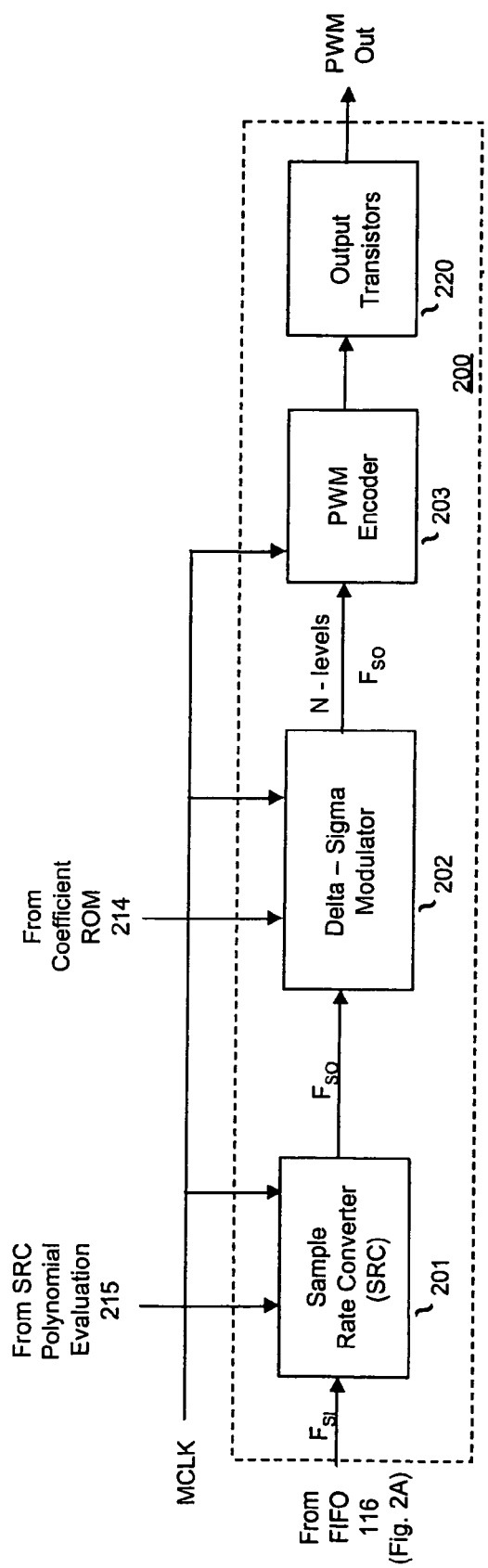
FIG. 2B is a more detailed block diagram of the pulse-width modulation (PWM) stage shown in FIG. 2A.

FIG. 2A is more detailed block diagram of APA 114 shown in FIG. 1. Generally, the embodiment of APA 114 shown in FIG. 2A is based on a pulse width modulation (PWM) stage 200, which is shown in further detail in FIG. 2B. PWM stage 200 includes a sample rate converter (SRC) 201, which converts a stream of digital samples from the input sample frequency $F_{SI}$ to the digital output sample frequency $F_{SO}$. The digital data stream output from SRC 201 is input into a delta-sigma modulator 202, which performs noise shaping and requantizes the data stream into requantized digital data samples, each representing N-number of information levels, at the output sample frequency $F_{SO}$. The requantized samples generated by delta-sigma modulator 202 are provided to a PWM encoder 203, which generates PWM encoded data patterns each representing one of the N-number of levels defined by the corresponding requantized data sample. PWM signal generation techniques are discussed in co-assigned U.S. Pat. No. 5,812,102 to Melanson, entitled "Delta Sigma PWM DAC to Reduce Switching," and incorporated herein by reference. The PWM encoded data drive a set of power output transistors 220, which may be in either a full-bridge or half-bridge configuration.

The number of levels $N_{Level}$ represented by each sample output from delta-sigma modulator 202 into PMW encoder 203 generally depends on the frequency at which radio 100 is tuned to, the input data frequency $F_{SI}$, and the output frequency $F_{SO}$ of the data stream output from SRC 201. Generally, the number of levels $N_{Level}$ varies as the output sample frequency $F_{SO}$ "hops" to avoid the frequency at which radio 100 is being tuned. For discussion purposes, a two—frequency hopping system based on the following characteristics will be assumed, although the number of possible frequency hops in the output sample frequency $F_{SO}$, as well as the chosen master clock frequency $F_{MCLK}$, the chosen output sample frequencies $F_{SO}$, and the number of quantizer levels, may vary depending on the specific system. The base mode for this exemplary embodiment is:

$F_{MCLK}$=24.576 MHz $F_{SO}$=384 kHz $N_{Level}$=65.

For the frequency-shift (frequency hopping) mode of operation:

$F_{MCLK}$=24.576 MHz $F_{SO}$=341.333 kHz $N_{Level}$=73.

It is a common practice to design a quantizer, such as the quantizer of delta-sigma modulator 202, to output quantized samples representing $2^n+1$ number of information levels because a $2^n+1$ level quantizer typically performs a simple truncation, which eliminates all but the first n+1 number of most significant bits (MSBs) of the sample. On the other hand, changing the quantization level to 73, for example, requires a 73-level quantizer, which cannot be implemented utilizing simple truncation. However, one economical way of implementing 73-level quantization, is to multiply each sample by 72 and then extract the first 7 MSB's by truncation. Advantageously, 72 can be numerically decomposed as 9×8 so that, in actual computation, a multiplication by 72 only amounts to a multiplication by 9 followed by a shift by 3 MSBs. Furthermore, because 9 is equal to 8+1 and a multiplication by 8 only requires a fixed shifter, a multiplication by 9 can also be realized by a simple adder and a shifter.

When a quantizer is used in the context of delta-sigma modulator, there always is a feedback path from the quantizer output to a summer at the modulator input. Consequently, if the data samples are multiplied by 9 before quantization, the quantizer output must be divided by 9 before feedback. In some delta-sigma modulator topologies, mostly "feedforward" architectures, an actual division (or, equivalently, a multiplication) must be performed in the feedback loop during frequency hopping. In other topologies, mostly "feedback" architectures, however, the division can be done implicitly by simply scaling the feedback coefficients during frequency hopping by 9 using a read-only memory (ROM) based table.

As shown in FIG. 2A, the system master clock (MCLK) signal is provided to an MCLK frequency divider 204. In the illustrated embodiment, PWM stage 200 operates at one of two output sample frequencies $F_{SO}$, namely $F_{MCLK}/64$ and $F_{MCLK}/72$. Consequently, two corresponding clock signals at the frequencies $F_{MCLK}/64$ and $F_{MCLK}/72$, along with a clock signal at the frequency $F_{MCLK}/64$ /8 and a clock signal at the frequency $F_{MCLK}/72$ /9, both of which corresponds to a frequency of eight (8) times the corresponding output sample frequency $F_{SO}$, are output by MCLK frequency divider 204.

Sample clock signal recovery circuitry 205 receives the sample clock signal (LRCK) at the input sampling frequency $F_{SI}$ and outputs internal clock signals at selected multiples of $F_{SI}$. In the illustrated embodiment, sample clock signal recovery circuitry 205 generates internal clock signals of eight times the input sampling frequency $F_{SI}$ ($8*F_{SI}$), sixteen times the input sampling frequency $F_{SI}$ ($16*F_{SI}$), one hundred and twenty eight times the input sampling frequency $F_{SI}$ ($128*F_{SI}$), and two hundred and fifty six times the input sampling frequency $F_{SI}$ ($256*F_{SI}$). Sample clock signal recovery circuitry also determines whether the input data stream will be interpolated by two in ×2 interpolator 206 or input directly at the input sample frequency $F_{SI}$.

Shifting the number of PMW levels, as required to avoid interference in the radio frequency band is implemented by the PWM level select (PWML) signal generated in response to user tuning of radio 100 of FIG. 1. In response to the PWML signal, a selector 207 selects between the clock signal at the frequency $F_{MCLK}/64$ /8 or the clock signal at the frequency $F_{MCLK}/72$ /9, as generated by MCLK frequency divider 204. At the same time, in response to the interpolation decision performed by sample clock signal recovery circuitry 205, multiplexer 208 selects from either the clock signal at the frequency $8*F_{SI}$ or the clock signal $16*F_{SI}$ generated by sample clock signal recovery circuitry 205. The selected signal output by multiplexer 207, and the clock signal selected by multiplexer 208, are provided to upsample rate estimator 209, which generates an output representing the output sample frequency to input sample frequency ratio $F_{SO}/F_{SI}$.

The PWML signal also controls the selection by multiplexer 210 of either the clock signal at the frequency $F_{MCLK}/64$ or the clock signal at the frequency $F_{MCLK}/72$ generated by MCLK frequency divider 204. Concurrently, the interpolation decision signal generated by sample clock signal recover circuitry 205 selects between the clock signals at the frequencies $128*F_{SI}$ and $256*F_{SI}$, generated by sample clock signal recovery circuitry 205, through a multiplexer 211. The clock signal at the output frequency $F_{SO}$ selected by multiplexer 210 and the clock signal selected by multiplexer 211 provided to a rate estimator circuit 212.

In response to the frequency ratio $F_{SO}/F_{SI}$ generated by upsample rate estimator 209, the current output frequency $F_{SO}$ selected by multiplexer 210 in response to the PWML signal, and the oversampling rate selected by multiplexer 211, rate estimator 212 provides an estimate of the difference between the output sample frequency $F_{SO}$ and the input sample frequency $F_{S}$. The estimation provided by rate estimator 212 is utilized by SRC polynomial evaluation circuitry 215, which controls the selection of the coefficients required by SRC 201 of FIG. 2B to convert the input sample frequency $F_{SI}$ of the data stream output from first and first out (FIFO) register 216 to the output sample frequency $F_{SO}$. The PWML signal additionally selects a set of coefficients from read only memory (ROM) 214, which are utilized by delta-sigma modulator 202 of FIG. 2B for noise shaping the sample stream at the selected output sample frequency $F_{SO}$.

In alternate embodiments of radio receiver 100, the source sample rate may be varied in ADCs 107 to implement frequency hopping. In these embodiments, SRC 201 of FIG. 2A may be eliminated.

The same inventive principles may be similarly implemented in switched-mode power supply 115 of FIG. 1 to ensure that any generated switching noise is shifted out of the radio frequency band of interest to avoid interference during signal reception by radio 100. In sum, according to the inventive principles, the switching frequency of a switched-mode (PWM) circuit is shifted such that the fundamental switching frequency and its harmonics fall outside the frequency band of interest, while the quantization level of the generating digital sample stream is proportionally varied to minimize the loss of information.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A pulse width modulation circuit comprising:
   a pulse width modulation encoder for encoding a data sample stream into pulse width modulated patterns; and
   circuitry for providing a data sample stream with a selectable sample frequency and a selectable range of information levels to the pulse width modulation encoder and including a delta sigma modulator quantizer for providing the data sample stream to an input of the pulse width modulation encoder at a selected sample frequency and with a selected range of quantization levels corresponding to a selected one of a plurality of ranges of information levels, wherein each level within the selected range of information levels corresponds to a digital number and each sample within the data sample stream at the selected sample frequency represents a level within the selected one of the plurality of ranges of information levels and wherein the selected sample frequency and the selected one of the plurality of ranges of information levels are selected such that noise generated at the sample frequency during encoding of the data sample stream into pulse width modulated patterns avoids a selected frequency band.

2. The pulse width modulation circuitry of claim 1, wherein the circuitry for providing the data sample stream comprises a sample rate converter for selecting the sample frequency.

3. The pulse width modulation circuitry of claim 1, further comprising analog to digital converter circuitry for generating the data sample stream and wherein the circuitry for providing the data sample stream comprises circuitry for selecting an output sample rate of the analog to digital converter circuitry.

4. The pulse width modulation circuitry of claim 1, wherein the pulse width modulation encoder and the circuitry for providing the data sample stream operate in response to a fixed-frequency oversampling clock signal.

5. The pulse width modulation circuitry of claim 1, wherein the circuitry for providing the data sample stream comprises:
- a sample rate converter for converting the data sample stream from an input sample frequency to a selected output sample frequency; and
- a delta-sigma modulator for requantizing the data sample stream into samples within a corresponding range of quantization levels in response to the selected output sample frequency.

6. The pulse width modulation circuitry of claim 5, further comprising:
- an estimator circuit for determining a ratio between the input sample frequency and the selected output sample frequency;
- circuitry for selecting a set of coefficients for converting the data samples in the sample rate converter from the input sample frequency to the selected output sample frequency in response to the estimated ratio; and
- circuitry for selecting a set of delta-sigma modulator coefficients in response to the selected output sample frequency.

7. The pulse width modulation circuitry of claim 1, wherein the pulse width modulation circuitry forms a portion of an audio power amplifier.

8. The pulse width modulation circuitry of claim 1, wherein the pulse width modulation circuitry forms a portion of a power supply.

9. A method of performing pulse width modulation in a pulse width modulator comprising:
- in a first mode, generating pulse width modulated data patterns from a data sample stream output from a delta-sigma modulator quantizer with a first range of quantization levels at a first sample rate, the pulse width modulated data patterns generating noise at a frequency of an integer multiple of the first sample rate, wherein the first range of quantization levels is selected from a plurality of ranges of quantization levels and each quantization level of each of the plurality of ranges of quantization levels corresponds to a digital number;
- in a second mode, generating pulse width modulated data patterns from a data sample stream output from the delta-sigma modulator quantizer with a second range of quantization levels selected from the plurality of ranges of quantization levels and differing from the first number of quantization levels and at a second sample rate differing from the first sample rate, the pulse width modulated data patterns generating noise at a frequency of an integer multiple of the second sample rate; and
- selecting between the first and second modes to avoid creating interference in a target reduced-noise signal band from the noise generated by the pulse width modulated data patterns.

10. The method of claim 9, further comprising:
generating a high frequency clock signal; and
- dividing the high speed clock by a first divide ratio to generate a first sample clock signal for setting the first sample rate; and
- dividing the high speed clock signal by a second divide ratio to generate a second sample clock signal for setting the second sample rate.

11. The method of claim 9, further comprising setting the first sample rate and the second sample rate with a sample rate converter.

12. The method of claim 9, further comprising generating the data stream with a first number of quantization levels and the data stream with a second number of quantization levels with a delta-sigma modulator having a quantizer with a selectable number of output levels.

13. The pulse width modulation circuitry of claim 1, further comprising clock generation circuitry for generating, from a high speed clock signal, a set of sample clock signals for setting the selectable sample frequencies.

* * * * *